United States Patent [19]

English et al.

[11] Patent Number: 5,917,689

[45] Date of Patent: *Jun. 29, 1999

[54] GENERAL PURPOSE EOS/ESD PROTECTION CIRCUIT FOR BIPOLAR-CMOS AND CMOS INTEGRATED CIRCUITS

[75] Inventors: Stephen T. English, Groveland; Eric Nestler, Harvard; Andrew H. Olney, Burlington, all of Mass.

[73] Assignee: Analog Devices, Inc., Norwood, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/710,183

[22] Filed: Sep. 12, 1996

[51] Int. Cl.$^6$ ..................................................... H02H 3/22
[52] U.S. Cl. .............................................. 361/56; 361/111
[58] Field of Search ............................... 361/56, 58, 111, 361/91

[56] References Cited

U.S. PATENT DOCUMENTS

| | | |
|---|---|---|
| 3,819,986 | 6/1974 | Fukuoka . |
| 4,005,342 | 1/1977 | Davis . |
| 4,039,869 | 8/1977 | Goldman . |
| 4,061,928 | 12/1977 | Kessler . |
| 4,066,918 | 1/1978 | Heuner . |
| 4,186,418 | 1/1980 | Seiler . |
| 4,288,829 | 9/1981 | Tango . |
| 4,366,522 | 12/1982 | Baker . |
| 4,385,337 | 5/1983 | Asano . |
| 4,400,711 | 8/1983 | Avery . |
| 4,408,245 | 10/1983 | Pryor . |
| 4,456,940 | 6/1984 | Hammerberg . |
| 4,509,067 | 4/1985 | Minami . |
| 4,567,500 | 1/1986 | Avery . |
| 4,580,063 | 4/1986 | Torelli . |
| 4,605,980 | 8/1986 | Hartranft . |
| 4,630,162 | 12/1986 | Bell . |
| 4,631,567 | 12/1986 | Kokado . |
| 4,633,283 | 12/1986 | Avery . |
| 4,678,950 | 7/1987 | Mitake . |

(List continued on next page.)

OTHER PUBLICATIONS

U.S. application No. 08/123,604, Wolfe, filed Sep. 17, 1993.
U.S. application No. 08/501,999, Olney, filed Jul. 13, 1995.
U.S. application No. 08/494,167, Minogue, filed Jun. 23, 1995.
U.S. application No. 08/486,933, English, filed Jun. 30,1995.
U.S. application No. 08/583,612, Olney, filed Jan. 5, 1996.
U.S. application No. 08/747,217, Singer, filed Nov. 12, 1996.

*Primary Examiner*—Jeffrey Gaffin
*Assistant Examiner*—Michael J. Sherry
*Attorney, Agent, or Firm*—Wolf Greenfield & Sacks, P.C.

[57] ABSTRACT

An apparatus and method for protecting integrated circuits from electrical overstress and eletrostatic discharge is provided. The apparatus includes a primary EOS/ESD protection device and a feedback circuit. The feedback circuit maintain the primary EOS/ESD protection device in an off state during normal operation of the integrated circuit and switches the primary protection device to an state when an EOS/ESD event occurs at a first input pad with respect to a second input pad of the integrated circuit.

13 Claims, 4 Drawing Sheets

U.S. PATENT DOCUMENTS

| | | |
|---|---|---|
| 4,692,834 | 9/1987 | Iwahashi . |
| 4,698,720 | 10/1987 | Finaurini . |
| 4,739,378 | 4/1988 | Ferrari . |
| 4,811,155 | 3/1989 | Kuriyama . |
| 4,819,047 | 4/1989 | Gilfeather . |
| 4,829,350 | 5/1989 | Miller . |
| 4,835,653 | 5/1989 | Zhang . |
| 4,839,768 | 6/1989 | Daniele . |
| 4,855,620 | 8/1989 | Duvvury . |
| 4,858,055 | 8/1989 | Okitaka . |
| 4,868,705 | 9/1989 | Shiochi . |
| 4,870,530 | 9/1989 | Hurst . |
| 4,896,243 | 1/1990 | Chatterjee . |
| 4,930,036 | 5/1990 | Sitch . |
| 4,939,616 | 7/1990 | Rountree . |
| 4,949,212 | 8/1990 | Lenz . |
| 4,996,626 | 2/1991 | Say . |
| 5,034,845 | 7/1991 | Murakami . |
| 5,051,860 | 9/1991 | Lee . |
| 5,086,365 | 2/1992 | Lien ........................................... 361/58 |
| 5,144,519 | 9/1992 | Chang . |
| 5,157,573 | 10/1992 | Lee . |
| 5,159,518 | 10/1992 | Roy . |
| 5,196,981 | 3/1993 | Kuo . |
| 5,200,876 | 4/1993 | Takeda . |
| 5,208,719 | 5/1993 | Wei . |
| 5,218,506 | 6/1993 | Harris . |
| 5,237,395 | 8/1993 | Lee ........................................... 257/358 |
| 5,239,440 | 8/1993 | Merrill . |
| 5,268,588 | 12/1993 | Marum . |
| 5,272,586 | 12/1993 | Yen . |
| 5,276,582 | 1/1994 | Merrill . |
| 5,287,241 | 2/1994 | Puar . |
| 5,289,334 | 2/1994 | Ker . |
| 5,291,051 | 3/1994 | Hoang . |
| 5,291,365 | 3/1994 | Takagi . |
| 5,301,084 | 4/1994 | Miller . |
| 5,311,391 | 5/1994 | Dungan et al. ........................... 361/56 |
| 5,319,259 | 6/1994 | Merrill . |
| 5,333,093 | 7/1994 | Krautschneider . |
| 5,335,134 | 8/1994 | Stein . |
| 5,343,352 | 8/1994 | Nagamine . |
| 5,345,356 | 9/1994 | Pianka . |
| 5,345,357 | 9/1994 | Pianka ....................................... 361/56 |
| 5,359,211 | 10/1994 | Croft . |
| 5,392,185 | 2/1995 | Haas, Jr. . |
| 5,400,202 | 3/1995 | Metz . |
| 5,406,105 | 4/1995 | Lee . |
| 5,412,527 | 5/1995 | Husher . |
| 5,424,892 | 6/1995 | Topp . |
| 5,426,323 | 6/1995 | Reczek . |
| 5,430,595 | 7/1995 | Wagner . |
| 5,440,162 | 8/1995 | Worley . |
| 5,450,267 | 9/1995 | Diaz . |
| 5,452,171 | 9/1995 | Metz . |
| 5,453,900 | 9/1995 | Feldtkeller . |
| 5,455,732 | 10/1995 | Davis . |
| 5,463,520 | 10/1995 | Nelson . |
| 5,473,500 | 12/1995 | Payne . |
| 5,477,413 | 12/1995 | Watt . |
| 5,477,414 | 12/1995 | Li . |
| 5,479,039 | 12/1995 | Lien . |
| 5,495,118 | 2/1996 | Kinoshita . |
| 5,514,893 | 5/1996 | Miyanaga et al. ....................... 257/360 |

GENERAL PURPOSE EOS/ESD PROTECTION CIRCUIT FOR BIPOLAR-CMOS AND CMOS INTEGRATED CIRCUITS

BACKGROUND OF THE INVENTION

1. Field of the Invention

The present invention relates generally to integrated circuits, and more particularly, to a method and apparatus for protecting integrated circuits from electrical overstress and electrostatic discharge.

2. Discussion of the Related Art

Electrical overstress (EOS) of an integrated circuit generally results from an external source discharging large transient voltages typically over a short period of Lime onto a terminal or pin of the integrated circuit. EOS events include very fast transients such as electrostatic discharge (ESD), and slower transients produced by powerline glitches or dropouts.

Electrostatic discharge or ESD is a well-known cause of operation failure of integrated circuits. The build-up of electrostatic charge on personnel and equipment during the manufacture and use of integrated circuits may assume potentials as high is 30,000 volts with respect to an ESD reference point. The built-up charge may be dischargec through an integrated circuit when either the personnel or the equipment comes in contact with the integrated circuit. The electrostatic discharge may occur during manufacturing or testing when the integrated circuit is non-operating, or it may occur when the integrated circuit is installed in a device and is operating. Integrated circuits are particularly susceptible to ESD damage during handling in a manufacturing, testing or printed circuit board assembly environment.

An electrostatic discharge through an integrated circuit can permanently damage the integrated circuit through several failure mechanisms including the dielectric breakdown of oxides and other thin layers, the melting of conductive material such as polysilicon or aluminum, and the melting of semiconductor material such as silicon, resulting in excessive leakage currents and open or short circuits in the integrated circuit.

Several test procedures exist for testing integrated circuits and determining sensitivity threshold levels of integrated circuits to electrostatic discharge. These test procedures include: American National Standards Institute (ANSI)/ESD Association Standard S5.1 Human Body Model (HBM) for simulating an ESD event generated by the human body; ANSI/ESD Association Standard S5.2 Machine Model (MM) for simulating an ESD event generated by a charged metal object such as a machine; and ESD Association Draft Standard DS5.3 Socketed Charge Device Model (SCDM) for simulating electrostatic discharges to integrated circuits during manufacture and test due to the use of automated equipment. Because of the pervasive use of automated equipment in testing, handling and manufacturing of integrated circuits, SCDM discharges are the predominant cause of manufacturing-related ESD failures. Devices which exhibit low thresholds to damage from an electrostatic discharge may be subject to special handling procedures and may also incorporate EOS/ESD protection devices.

The special handling procedures may include the use of anti-static materials on manufacturing floors, bench tops, and other surfaces used during the manufacture and testing of integrated circuits. Additionally, operators handling sensitive integrated circuits may be required to wear wrist or ankle straps that are resistively connected to a voltage potential such as ground, to prevent electrostatic charge build-up on their bodies.

Integrated circuits containing metal oxide semiconductor (MOS) transistors are particularly sensitive to electrostatic discharge at their input, output, and supply pins. Several approaches to FOS/ESD protection circuits have been developed to protect MOS transistors from EOS/ESD events at their input, output, and supply pins. These circuits often consist of large parallel protection circuits, external to the devices to be protected, which comprise diodes, thick oxide MOS devices, and silicon controlled rectifiers (SCRs). These large parallel protection circuits often also include a series resistor. U.S. Pat. No. 4,829,350, titled "Electrostatic Discharge Integrated Circuit Protection", and issued to Bernard D. Miller, discloses in ESD protection circuit for the input pins of CMOS integrated circuits that includes a series resistor and parallel clamping diodes. This patent also discloses the use of clamping diodes disposed in parallel with the output pins to provide ESD protection for the output pins. U.S. Pat. No. 4,896,243, titled "Efficient ESD Input Protection Scheme", and issued to Amitava Chaterjee, et al., similarly discloses an ESD protection circuit for the input of an integrated circuit that employs a series resistor and a parallel clamping diode.

There are several known disadvantages to using the ESD protection circuits of the prior art. Parallel clamping diodes require a relatively large area, exhibit undesirable parasitic capacitance and leakage current, and may have undesirably high "on" resistance. Also, such large diode clamps require a low impedance return path as described in U.S. Pat. No. 4,839,768, titled "Protection of Integrated Circuits From Electrostatic Discharges", and issued to Viscenzo Daniele, et al. Without a low impedance return path, the effectiveness of these large diode clamps is greatly reduced. Additionally, large clamping devices may not be standard devices that can be included on integrated circuits without special processing steps. Furthermore, non-standard devices used to provide ESD protection in some cases are not manufactured to the same quality standards as the integrated circuits to be protected and, as a result, may have greater voltage breakdown tolerances, leading to less predictable ESD protection behavior. The use of series resistors in some applications also is undesirable, particularly on output pins, since series resistance reduces the drive capability of output drivers.

Other prior art FOS/ESD protection circuits utilize an NMOS protection device that is off during normal circuit operation in the absence of an EOS or ESD event. During an EOS/ESD event, the off NMOS device exhibits a reverse breakdown that triggers parasitic bipolar transistor action that discharges the EOS/ESD event through a number of discharge channels or "fingers" that are formed in the device. These prior art NMOS protection devices also lave several associated problems. The parasitic parameters of NMOS devices typically are not well controlled, and accordingly, the voltage at which an NMOS device will brealk down and the current at which it will exhibit bipolar snap back to a lower voltage are not well controlled. Also, the large parasitic parameters associated with these devices preclude their use in some applications. Further, individual fingers within an NMOS device will turn or at different times in response to an EOS/ESD event. This results in a non-uniform distribution of discharge current through the device and causes localized "hot" spots which may damage the NMOS device. To compensate for the above described limitations, the prior art NMOS protection devices typically are relatively large, to allow for parallel discharge of an EOS/FSD event through a plurality of fingers to reduce localized heating.

SUMMARY OF THE INVENTION

Embodiments of the present invention provide an EOS/ESD protection circuit that overcomes the above-described limitations of prior art devices. Specifically, EOS/ESD protection circuits in accordance with embodiments of the present invention include a primary EOS/ESD protection device coupled to a feedback circuit that ensures that the primary EOS/ESD protection device is well-controlled and is turned on uniformly in response to an EOS/ESD event.

In one embodiment of the present invention, a transient protection circuit for protecting semiconductor devices from EOS/ESD events has first and second inputs. The transient protection circuit includes a first clamping circuit that operates in one of two operational states based on a control signal. In a first operational state, the first clamping circuit provides a short circuit from the first input of the transient protection circuit to the second input of the transient protection circuit to discharge EOS/ESD current, and in a second operational state, the clamping circuit provides an open circuit from the first input of the transient protection circuit to the second input of the transient protection circuit. The transient protection circuit further includes a first feedback circuit that detects the presence of an EOS or ESD condition and provides the control signal to the first clamping circuit.

In embodiments of the present invention, the first clamping (circuit and the feedback circuit comprise MOS transistors.

In another embodiment of the present invention, the transient, protection circuit described above further includes a third input, a second clamping circuit and a second feedback circuit. The second clamping circuit operates in one of two operational states under the control of a control signal to provide either a short circuit or an open circuit front the third input to the second input of the transient protection circuit. The transient protection circuit also includes a second feedback circuit for providing the control signal to the second clamping circuit when an EOS or ESD event occurs at the third input of the transient protection circuit.

In another embodiment of the invention, an integrated circuit has first, second and third inputs, internal circuitry, and a transient protection circuit in accordance with embodiments of the invention described above.

In yet another embodiment of the invention, the integrated circuit further includes a resistor coupled between the second input of the integrated circuit and the internal circuitry.

In another embodiment of the present invention, a method for protecting an integrated circuit having first, second and third inputs from EOS/ESD events includes steps of coupling a first clamping circuit between the second and third inputs of the integrated circuit, detecting an overvoltage condition at the second input of the integrated circuit, providing a first feedback signal to the first clamping circuit to select a first operational state upon occurrence of the overvoltage condition, and providing a second feedback signal to the first clamping circuit to select a second operational state when an overvoltage condition is not detected.

DESCRIPTION OF THE FIGURES

For a better understanding of the present invention, reference is made to the accompanying drawings, which are incorporated herein by reference and in which.

DETAILED DESCRIPTION

An EOS/ESD protection device is disclosed in U.S. patent application Ser. No. 08/496,933 titled "Electrostatic Discharge Protection Circuit For Protecting CMOS Transistors on Integrated Circuit Processes" and assigned to the assignee of the present application. In the device disclosed, a PMOS transistor is used to turn on an NMOS transistor of an inverter when an ESD event occurs at the output of the inverter. The ESD event is discharged through the NMOS device. This protection device is used on inverters and the NMOS transistor of the inverter must be sufficiently robust to safely discharge the ESD current.

Figure 1:
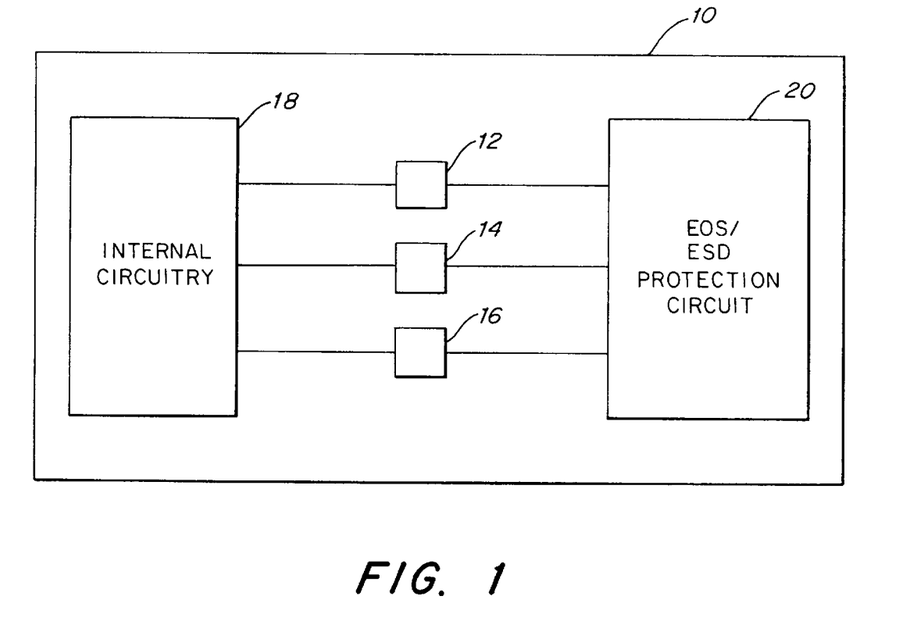
FIG. 1 is a bock diagram of an integrated circuit incorporating an EOS/ESD protection circuit in accordance with one embodiment of the present invention.

Shown in FIG. 1 is one embodiment of the present invention of an integrated circuit 10 incorporating an EOS/ESD protection circuit 20 for protecting internal circuitry 18 of the integrated circuit from electrical overstress/electrostatic discharge.

Integrated circuit 10 includes a voltage supply pad 12, an input/output (I/O) pad 14 and a ground pad 16 for respectively connecting to a voltage supply source, external circuitry, and a ground reference. An input/output (I/O) pad is defined as either an input pad, an output pad or a pad that can be used for an input signal or an output signal. The integrated circuit 10 also includes internal circuitry 18 for performing a specific designed function of the integrated circuit and an EOS/ESD protection circuit 20 for protecting components of the internal circuitry 18 from EOS/ESD events that occur on pins connected to the pads 12, 14 and 16 of the integrated circuit. In embodiments of the invention, the integrated circuit 10 may include multiple I/O pads 14 and multiple EOS/BSD protection circuits 20. The ground pad 16 cf the integrated circuit may be connected to the substrate of the integrated circuit.

Figure 2:
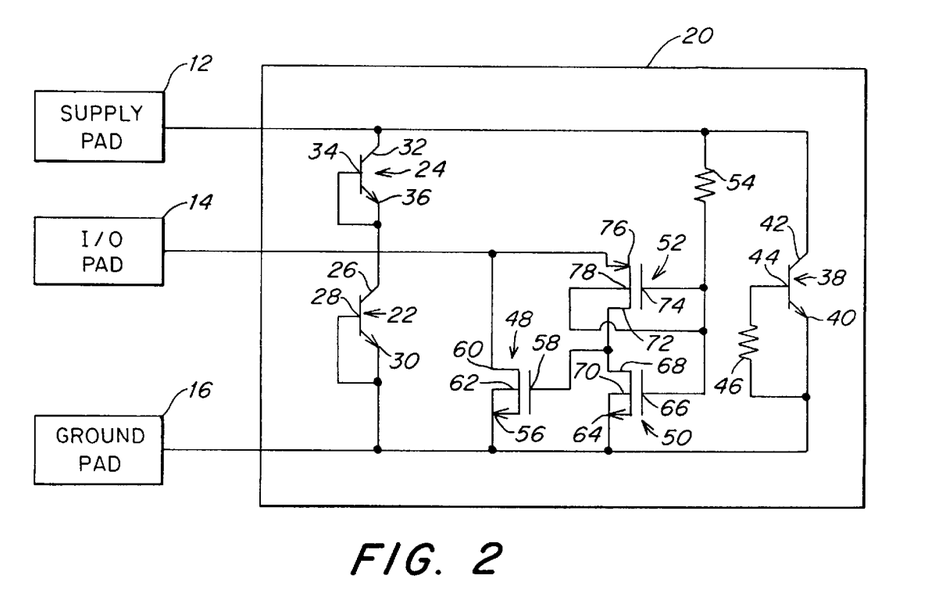
FIG. 2 is a schematic diagram of the EOS/ESD protection circuit of the integrated circuit of FIG. 1.

A more detailed schematic of the EOS/ESD protection circuit 20 of FIG. 1 is shown in FIG. 2. The EOS/ESD protection circuit 20 includes two diode-connected vertical NPN transistors 22 and 24. Transistor 22 has an emitter 30 connected to the ground pad 16, a base 28 connected to the emitter 30 and a collector 26 connected to the I/O pac 14. Transistor 24 has an emitter 36 connected to the I/O pad 14, a collector 32 connected to the voltage supply pad 12 and a base 34 connected to the emitter 36.

The EOS/ESD protection circuit also includes a diode-connected lateral NPN transistor 38 having an emitter 40, a base 44 and a collector 42. The emitter 40 of transistor 38 is connected to the ground pad 16, the collector 42 of transistor 38 is connected to the voltage supply pad 12 and the base 44 of transistor 38 is connected to the emitter 40 through the substrate of the integrated circuit 10. A resistor 46 is shown connected between the base 44 of transistor 38 and the emitter 40 to represent the resistance of the substrate of transistor 38.

The EOS/ESD protection circuit 20 also includes three CMOS transistors 48, 52 and 50 and a resistor 54. Transistor 48 is an NMOS transistor having a source 56 connected to the ground pad 16, a gate 58, a drain 60 connected to the I/O pad 14 and E back gate 62 connected to the ground pad 16. As described in further detail below, transistor 48 functions as the primary protection device of the EOS/ESD protection circuit 20.

Transistor 50 is an NMOS transistor having a source 64 connected to the ground pad 16, a drain 68 connected to the gate 58 of transistor 48, a gate 66, and a back gate 70 connected to the ground pad 16. Transistor 52 is a PMOS transistor having a source 76 connected to the I/O pad 14, a gate 74, a drain 72 connected to the drain 68 of transistor 50, and a back gate 78 connected to the gate 74. The resistor 54 has a first terminal connected to the supply pad 12 and a second terminal connected to the gate 74 of transistor 52 and the gate 66 of transistor 50. As described in further detail below, transistors 50 and 52 form a feedback circuit for controlling the primary protection device, transistor 48.

The level of protection offered by the ELOS/ESD circuit 20 is, at least in part, dependent on the relative sizing of the CMOS transistors 48, 50 and 52 shown in FIG. 2. In a preferred embodiment the gate width and length for each of the CMOS transistors shown in FIG. 2 is as shown in Table 1.

TABLE 1

| Gate Dimensions | Transistor 48 | Transistor 50 | Transistor 52 |
| --- | --- | --- | --- |
| Length ($\mu$m) | 2 | 15 | 2 |
| Width ($\mu$m) | 100 | 4 | 10 |

However, unlike most prior art MOS protection circuits, the level of EOS/ESD protection provided by the present circuit is directly proportional to the width of the primary protection device (transistor 48). Thus, for example, by doubling the width of transistor 48 to 200$\mu$m, the amount of EOS/ESD protection will be doubled. This "programmability" is a major advantage of the circuit that results from it being designed to uniformly turn on all fingers in response to an EOS/ESD event.

In the embodiment shown in FIG. 2, the EOS/ESD protection circuit 20 is fabricated using a bipolar-CMOS process. This embodiment of the invention is also applicable to straight CMOS processes with only minimal changes. The vertical diode-connected NPN transistors 22 and 24 could be replaced by simple diodes in a CMOS process. The lateral diode-connected NPN transistor 38 could be fabricated in a CMOS process using two parallel N-source/drain diffusions in P-epi/P-substrate or P-well.

The operation of the EOS/ESD protection circuit 20 shown in FIG. 2 will be described hereinafter under the five following conditions: 1) during normal operation of the integrated circuit in the absence of an EOS/ESD event; 2) when an EOS/ESD event occurs at the I/O pad 14 having a positive polarity with respect to the ground pad 16; 3) when an FOS/ESD event occurs at the I/O pad 14 having a negative polarity with respect to the ground pad 16; 4) when an EOS/ESD event occurs at the voltage supply pad 12 having a positive polarity with respect to the I/O pad 14; and 5) when an EOS/ESD event occurs at the voltage supply pad 12 having a negative polarity with respect to the I/O pad 14.

The first condition to consider is normal operation of the integrated circuit 10 in the absence of an EOS/ESD event. During normal operation of the integrated circuit 10 with a positive voltage supply connected between the supply pad 12 and the ground pad 16, the gate 66 of NMOS transistor 50 is always high as it is connected to the positive voltage supply through resistor 54, and the source 64 of transistor 50 is always low as it is connected to the ground pad 16. Accordingly, transistor 50 is always on during normal operation. The voltage at the I/O pad 14 during normal operation of the integrated circuit 10 is at or below the positive supply voltage connected to the supply pad 12. Therefore, the voltage at the source 76 of transistor 52 is equal to or below the voltage at the gate 74 and accordingly, transistor 52 is off.

With transistor 52 off and transistor 50 on, the gate 58 of transistor 48 is always low, ensuring that transistor 48 is fully off and draws minimal leakage current from the I/O Pad 14. In addition, each of the diode-connected NPN transistors 22, 24 and 38 has its respective collector at a positive voltage with respect to its shorted emitter base terminal less than its breakdown voltage, keeping each of these devices off. Therefore, in the absence of an EOS/ESD event, the EOS/ESD protection circuit 20 has minimal effect on the operation of the integrated circuit 10.

The operation of the EOS/ESD protection circuit 20 under the second condition, with a positive EOS/ESD event at the I/O pad 14 with respect to the ground rad 16, will now be described. When a positive EOS/ESD event occurs at the I/O pad 14, the source 76 of transistor 52 is raised to a voltage level well above the voltage level at the gate 74 of transistor 52. The voltage at the gate is either nominally at a ground potential (when the integrated circuit is unpowered) or is nominally at the supply voltage (when the integrated circuit is powered). With the source of transistor 52 at a significantly higher voltage potential the in the gate, transistor 52 is turned on very quickly due to the relatively small size of transistor 52.

When transistor 52 turns on, the voltage at gate 58 of transistor 48 is raised nearly to the voltage at the I/O pad 14 turning transistor 48 on. The voltage at gate 58 will be raised high in this condition even when power is applied to the integrated circuit. Because of the relative sizes of transistors 50 and 52, transistor 52 has a higher gain and is more dominant than transistor 50, so that the gate 58 of transistor 48 is almost simultaneously pulled high upon the occurrence of an EOS/ESD event which quickly turns on transistor 48. Transistor 48 is the primary EOS/ESD protection device, and when transistor 48 turns on, the EOS/ESD event is quickly discharged through transistor 48. Transistor 48 is relatively large and can discharge EOS/ESD events quickly without sustaining damage to protect other components of the integrated circuit 10.

As the EOS/ESD event is discharged, the voltage at the I/O pail 14 decreases along with the voltage at the source 76 of transistor 52. When the voltage at the source 76 with respect to the voltage at the gate 74 drops below the gate-source threshold voltage of transistor 52, transistor 52 turns off, thus turning off transistor 48, and the EOS/ESD protection circuit operates in condition 1 described above.

Unlike prior art protection schemes that rely on parasitic characteristics of semiconductor devices to turn on EOS/ESD protection devices, in the embodiment of the present invention described above, the primary EOS/ESD protection device is predictably turned on by the MOS transistor action of a standard MOS device (transistor 52) included within a feedback turn-on circuit. The feedback turn-on circuit ensures that the multiple fingers associated with transistor 48 will turn on simultaneously, thereby reducing localized heating within transistor 48 during discharge of an EOS/ESD event. Because of less concerns with localized heating within transistor 48, this device can be relatively compact in comparison with similar devices of the prior art, thus minimizing parasitic capacitance and leakage current.

The operation of the EOS/ESD protection circuit 20 under the third condition, with a negative EOS/ESD event at the I/O pad 14 with respect to the ground pad 16, will now be described. Under this condition, transistors 22 and 48 will operate as Forward biased diodes to discharge the EOS/ESD event once the voltage differential from the ground pad 16 to the I/O pad 14 exceeds a forward conduction threshold of transistors 22 and 48. This threshold for typical devices is on the order of 0.6 volts. Forward-biased diodes are relatively efficient at sinking EOS/ESD current and consequently these devices do not require special design considerations to perform this function.

The operation of the EOS/ESD protection circuit 20 under the fourth condition, with a positive EOS/ESD event at the supply pad 12 with respect to the I/O pad 14 will now be described. Under this condition, the breakdown voltage of the reverse-biased N-well to P-source junction of transistor 52 will be exceeded and the EOS/ESD current will begin to discharge from the supply pad 12 to the I/O pad 14 through transistor 52. In the embodiment shown in FIG. 2. this breakdown voltage is approximately 15 volts. Resistor 54 is with in the discharge path of the EOS/ESD event, and a voltage is developed across resistor 54. When the voltage across resistor 54 plus the voltage drop (approximately 15 volts) across the N-well to P-source junction of transistor 52 exceeds the combination of the forward conduction voltage of transistors 22 and 48 and the collector to emitter breakdown voltage of transistor 38, an alternate discharge path through transistor 38 (operating in breakdown mode) and through each of transistors 22 and 48 (operating as parallel diodes in forward conduction mode) will be established. Therefore, with resistor 54 limiting the EOS/ESD current through transistor 52, and the majority of the EOS/ESD current flowing through the alternate discharge path, transistor 52 is protected from damage. In a preferred embodiment, the collector to emitter breakdown voltage of transistor 38 is approximately 18 volts.

The operation of the EOS/ESD protection circuit 20 under the fourth condition, with a negative EOS/ESD event at the supply pad 12 with respect to the I/O pad 14 will now be described. Under this condition, transistors 24 and 52 act as forward-biased diodes and discharge the EOS/FSD event. Resistor 54 is disposed in the discharge path that includes transistor 52 and will limit the current through transistor 52.

Figure 3:
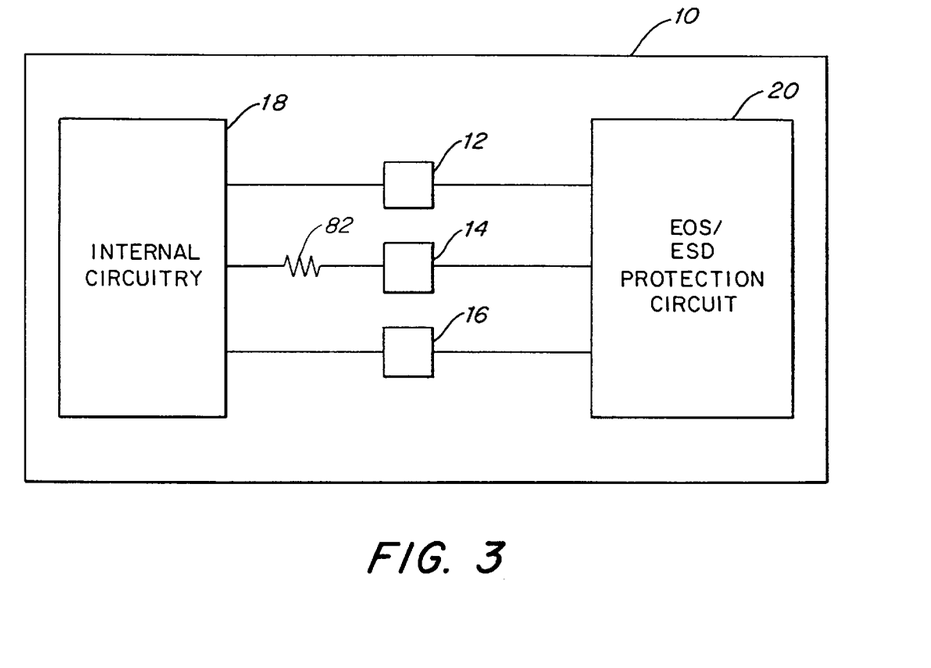
FIG. 3 is a diagram of an EOS/ESD protection circuit in accordance with a second embodiment of the present invention.

A second embodiment of an integrated circuit 110 incorporating EOS/ESD protection circuitry is shown in FIG. 3. The integrated circuit 110 of the second (embodiment is similar to the integrated circuit 10 of the first embodiment except that an additional resistor 82 is included between the I/O pad 14 and the internal circuitry 18. The resistor 82 provides additional FOS/ESD protection for components of the internal circuitry 18 by limiting the conduction through components of the internal circuitry 18 of any residual EOS/ESD current that is not discharged by the FOS/ESD protection circuit 20.

Resistor 82 adds series resistance in the signal path between the internal circuitry 18 and the I/O pad 14 resulting in attenuation of the desired input/output signals of this signal path. Accordingly, the use of resistor 82 to provide additional EOS/ESD protection is preferred for circuits having a high inherent input impedance such as that provided by the gate of a CMOS device for which the additional series resistance is negligible.

Figure 4:
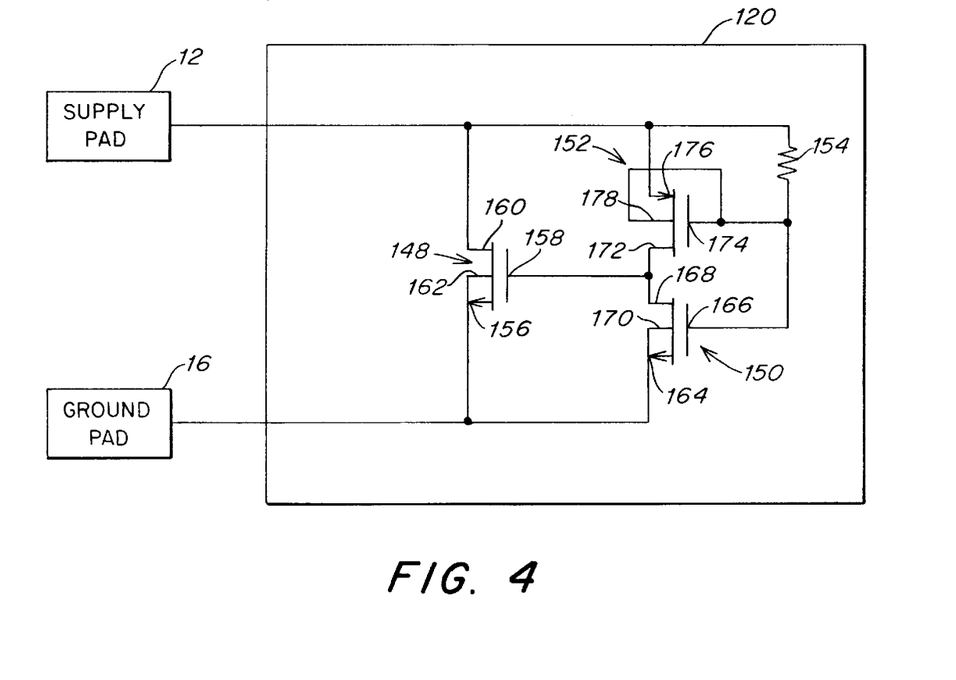
FIG. 4 is a schematic diagram of an EOS/ESD protection circuit in accordance with a third embodiment of the present invention.

A third embodiment of an EOS/ESD protection circuit for providing EOS/ESD protection for supply pins of an integrated circuit is shown in FIG. 4. The EOS/FSD protection circuit 120 shown in FIG. 4 provides EOS/ESD protection for an integrated circuit against an EOS/ESD event occurring at the supply pad 12 having a positive polarity with respect to the ground pad 16.

EOS/ESD protection circuit 120, similar to the EOS/ESD protection circuit 20 discussed above, includes a primary EOS/ESD protection device 148 and a feedback circuit, comprising a resistor 154, a PMOS transistor 152 and an NMOS transistor 150, for (controlling the primary EOS/ESD protection device 148.

The primary EOS/ESD protection device 148 consists of an NMOS transistor having a drain 160 connected to the voltage supply pad 12, a source 156 connected to the ground pad 16, a back gate 162 connected to the source 156, and a gate 158. NMOS transistor 150 has a drain 168 connected to the gate 158 of transistor 148, a source 164, connected to the ground pad 16, a back gate 170 connected to the source 164 and a gate 166. PMOS transistor 152 has a drain 172 connected to the drain 168 of transistor 150, a source 176 connected to the supply pad 12, a gate 174 connected to the gate 166 of transistor 150, and a back gate 178 connected to the gate 174.

Resistor 154 is connected between the supply pad 12 and the gates 174 and 166 of transistors 152 and 150. In a preferred embodiment, resistor 154 is a diffused series resistor having a resistance of approximately 350 ohms. Transistors 148, 150 and 152 of EOS/ESD protection circuit 120 are substantially identical to transistors 48, 50 and 52 of EOS/ESD protection circuit 20.

The operation of the EOS/ESD protection circuit 120 is similar to the EOS/ESD protection circuit 20 described above. During normal operation of an integrated circuit comprising the EOS/ESD protection circuit 120 with a positive supply having a voltage V+ coupled to the supply pad 12, transistor 152 will be off as the voltage from the gate 174 to the source 176 will be approximately 0 volts and transistor 150 will be on as the voltage from the gate 166 to the source 164 will be approximately V+. With transistor 150 on, the gate of transistor 148 will be held low, ensuring that transistor 148 is completely off and draws minimal leakage current from the supply pad 12.

When there is no power applied to the EOS/ESD protection circuit 120, all nodes of the EOS/ESD protection circuit will be approximately at ground potential, Under this condition, when an EOS/ESD event occurs at the supply pad 12 having a positive polarity with respect to the ground pad 16, the gates 166 and 174 of transistors 150 and 152 initially remain at or near ground potential due to the RC time constant associated with pulling these gates high. The RC time constant is due to resistor 154 and the combined gate to substrate capacitance of transistors 150 and 152. The source 176 of transistor 152 is directly connected to the supply pad 112 and the voltage at the source 176 rises quickly upon the occurrence of an EOS/ESD event at the voltage supply pad 12. With the voltage at the source 176 significantly greater than the gate 174, and due to its relatively small size, transistor 152 will conduct and raise the voltage at gate 158 turning on transistor 148. When transistor 148 turns on, the EOS/ESD event is efficiently discharged through transistor 148.

Depending on the amplitude of the EOS/ESD event, the voltage at gate 166 may continue to rise after transistor 148 turns on, and once the voltage across the gate 166 to the source 164 junction exceeds the gate-source threshold of transistor 150, transistor 150 will turn on. As in the previously described embodiments, due to the relative sizes of transistors 150 and 152, the gate 158 of transistor 148 will remain high, keeping transistor 148 on, while transistor 152, which is more dominant than transistor 150, remains on.

Transistor 152 remains on until the voltage from its source 176 to its gate 174 drops below the gate to source threshold of transistor 152. The value of the resistor 154 and the gate to substrate capacitance of transistors 150 and 152 are selected, based on the characteristics of a typical EOS/ESD event, such that transistor 152 remains on until the EOS/ESD event is essentially completely discharged. Transistor 150 will turn off once its gate to source voltage is less than its threshold voltage. This may occur due to the discharge of the EOS/ESD event through transistor 148, or if not, transistor 150 will turn off once the EOS/ESD event is over.

When an EOS/ESD event occurs at the supply pad 12 having a positive polarity with respect to the ground pad 16, with the EOS/ESD protection circuit 120 powered on (i.e. a power supply having a voltage of V+ coupled to the supply pad 12), the operation of the EOS/ESD protection circuit 120 is similar to the case described above when the EOS/ESD protection circuit is unpowered. However, with the EOS/ESD protection circuit 120 powered on, the gates 166 and 174 of transistors 150 and 152 are at approximately a voltage of V+ both before and after the EOS/ESD event and transistor 150 is on before, during and alter the EOS/ESD event.

Upon the occurrence of the EOS/ESD event, transistor 152 will turn on when the voltage from the source 176 to the gate 174 exceeds the gate to source threshold voltage of transistor 152. As in the first embodiment of the present invention described above, because of the relative sizes of transistors 150 and 152, transistor 152 will dominate over transistor 150 and significantly raise the voltage at the gate 158 of transistor 148 turning transistor 148 on. The EOS/ESD event is then dissipated through transistor 148. Transistor 152 remains on, holding transistor 148 on, until the voltage from source 176 to gate 174 drops below the gate to source threshold voltage of transistor 152. When transistor 152 turns off, transistor 150 pulls the gate 158 of transistor 148 low, turning off transistor 148 and keeping it off.

When an EOS/ESD event occurs at the supply pad 12 having a negative voltage with respect to the ground pad 16, transistor 148 will operate as a forward biased diode and readily discharge the EOS/ESD event without sustaining damage.

When unpowered, the EOS/ESD protection circuit 120 cannot differentiate between an EOS/ESD event at the supply pad 12 having a positive voltage with respect to the ground pad 16 and a rapid ramping up of the supply voltage at the supply pad during normal powering up of an integrated circuit incorporating the EOS/ESD) protection circuit 120. In both cases, the EOS/ESD protection circuit will operate as described above. However, this is not a limitation of this embodiment of the present invention, since transistor 148 will turn on and draw any significant current only during the transition of the supply voltage from 0 volts to V+. Typically an integrated circuit comprising the EOS/ESD protection circuit 120 is not required to operate during this transitional phase having a typical duration less than 1 millisecond.

Figure 5:
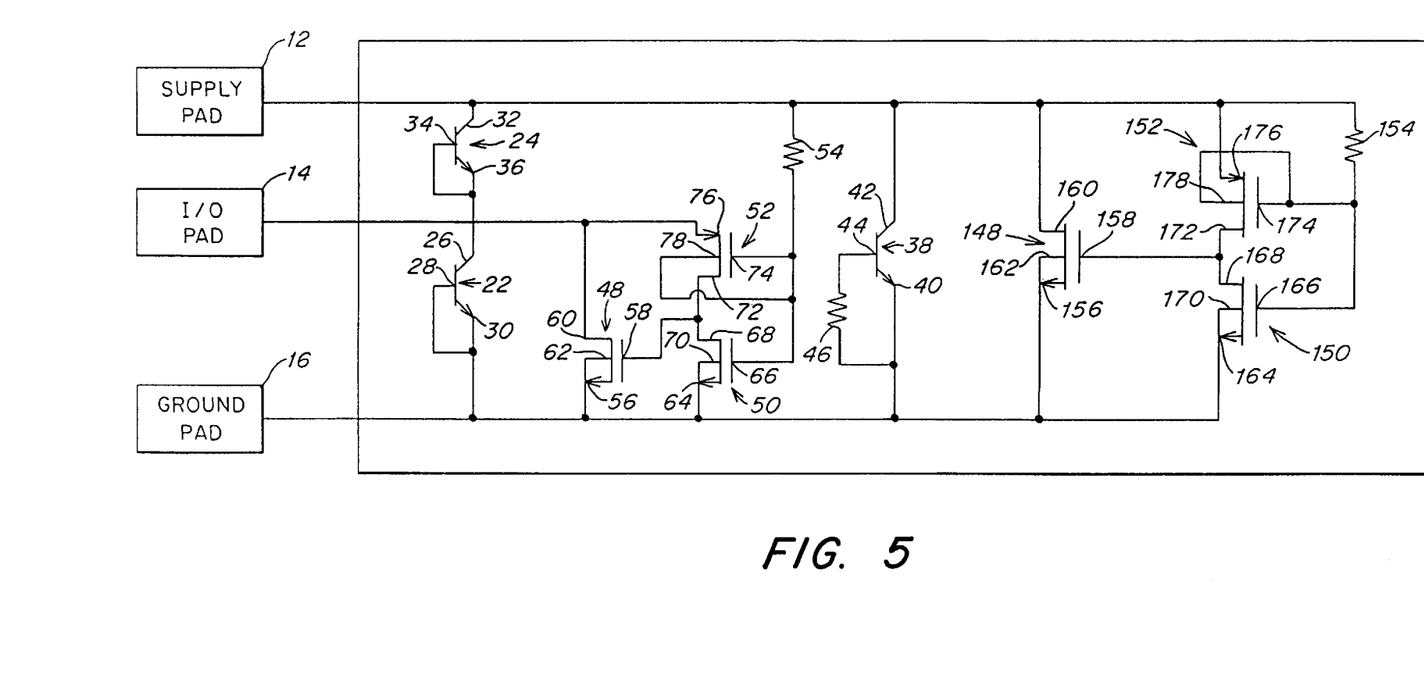
FIG. 5 is a schematic diagram of an EOS/ESD protection circuit according to another embodiment of the present invention that includes the protection circuits of FIGS. 2 and 4.

The embodiment of the present invention shown in FIG. 4 may be incorporated into an integrated circuit along with the embodiment of the invention shown in FIG. 2 to provide EOS/ESD protection for all of the pads of the integrated circuit. A circuit including the embodiments of FIGS. 2 and 4 is illustrated in FIG. 5.

Figure 6:
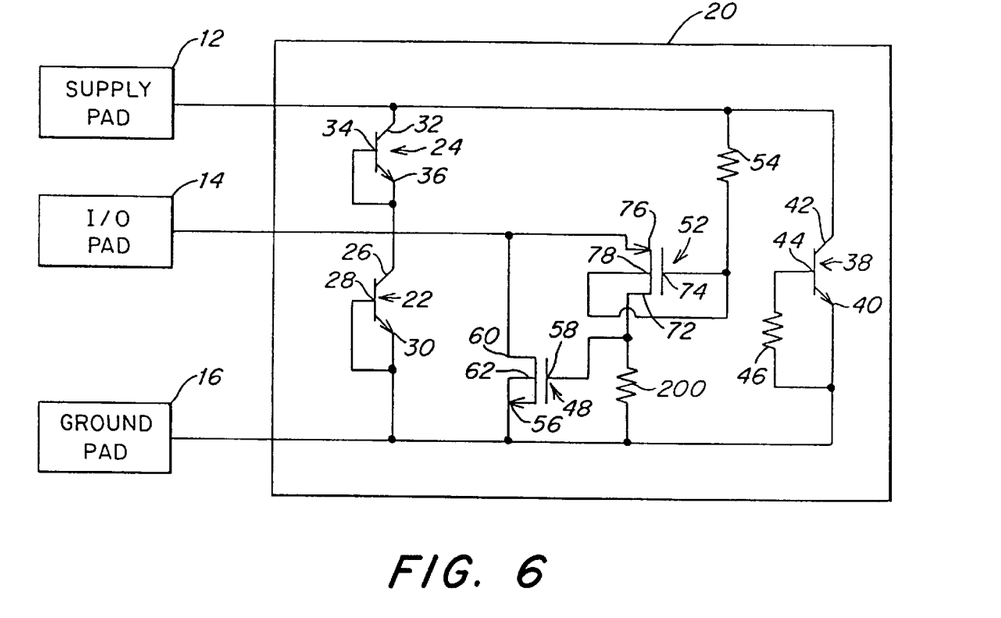
FIG. 6 is a schematic diagram of another embodiment of the present invention in which the transistor 50 in FIG. 2 is replaced with a resistor.
Figure 7:
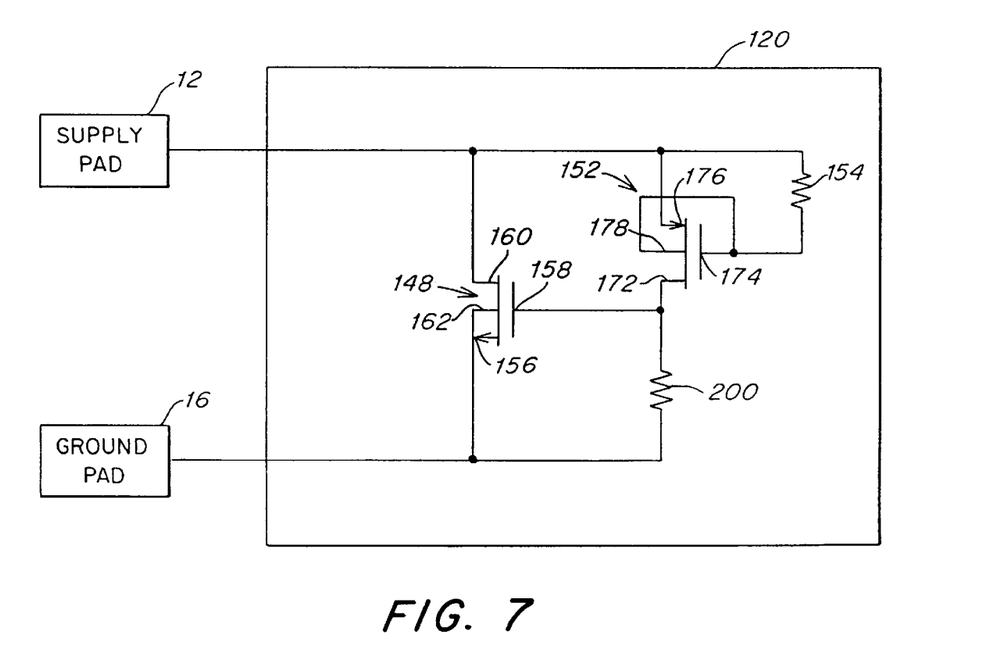
FIG. 7 is a schematic diagram of a further embodiment of the present invention in which the transistor 150 in FIG. 4 is replaced with a resistor.

In the embodiments of the invention shown in FIGS. 2 and 4, transistors 50 and 150 may be replaced by a resistor connected between the gate of the primary protection device and the ground pad 16 without substantially affecting the performance of the EOS/ESD protection circuits 20 and 120. Transistors 50 and 150 are used to pull the gate of the primary protection device to ground in the absence of an EOS/ESD event. A resistor 200 will accomplish the same function, as the current through the resistor, and therefore the voltage across the resistor, in the absence of an EOS/ESD event will essentially be zero. Embodiments using a resistor 200 that is connected between the gate of the primary protection device and the ground pad 16, rather than a transistor, are shown in FIGS. 6 and 7, respectively.

ESD performance testing was conducted on three output data pins of three samples of an integrated circuit having NMOS output devices and the FOS/ESD protection circuit of the present invention shown in FIG. 2. The NMOS output devices of the integrated circuit were relatively small having a width of 100 $\mu$m and a length of 2 $\mu$m. Testing was conducted in accordance with the ANSI/ESD Association Standard S5.1 Human Bodily Model (HBM), the ANSI/ESD Association Standard S5.2 Machine Model (MM) and the ANSI/ESD Association Draft Standard DS5.3 Socketed Charged Device Model (SCDM). The HBM and MM tests were conducted using a Verifier VIII ESD Test System manufactured by Verifier Systems Limited of Fleet, England, and the SCDM testing was conducted using a KeyTek Model 7/2 Zap/LatchMaster System manufactured by KeyTek Instrument Corp. of Lowell, Mass.

During the LBM and MM testing, three data pins of the integrated circuit under test were subjected to an electrostatic discharge stress sequence with respect to the Digital Ground pin of the integrated circuit. Each stress sequence consisted of three positive electrostatic discharges and three negative electrostatic discharges. The HBM testing was initiated at an amplitude of 500 volts and increased in 500 volt increments, while the MM testing was initiated at an ESD amplitude of 50 volts and increased in 50 volt increments.

During SCDM testing, the substrate pins of the integrated circuit (corresponding to the ground pins) were used to charge the samples under test, and discharging was accomplished through each of three data output pins of the integrated circuit. For each discharging sequence, three positive and three negative ESD pulses were used. The SCDM testing was initiated with an ESD amplitude of 100 volts and was increased in 100 volt increments.

Failure criteria for the ESD testing was established as follows. The input current at each of the data output pins of the integrated circuit under test was measured after each sequence of three stresses under two conditions: 1) with the voltage at the data output pin at 5.0 volts and with the supply voltages at 5.0 volts, and 2) with the voltage at the data output pin at 0.0 volts and the supply voltage at 5.0 volts. A failure was identified when the measured current exceeded 10 microamps. Failure analysis was conducted on each of the test samples. The results of this analysis indicate that the primary protection device, transistor 48, is turned on very uniformly during an ESD event, thus avoiding the problem of localized heating that occurs in off NMOS devices of the prior art.

The test results are shown in Table 2. It should be noted that the maximum SCDM test capability of the test instrumentation used was 1500 volts so that the actual SCDM failure voltage was not established.

TABLE 2

ESD Test Results

| Integrated Circuit Under Test | Sample Size Per ESD Model | Lowest Pass Voltage HBM Test (volts) | Lowest Pass Voltage MM Test (volts) | Lowest Pass Voltage CDM Test (volts) |
|---|---|---|---|---|
| IC1 | 3 | ±6500 | ±400 | ±1500 |

All pins on each of the three samples of the integrated circuit were also tested for latch-up susceptibility using the test method outlined in Joint Electron Device Engineering Council (JEDEC) Standard Number 17 with the supply voltages for the integrated circuit under test set for a voltage of 7.0 volts. The testing was conducted initially with all input pins grounded and subsequently with all input pins set to 5.0 volts. Each of the input and output pins was tested using positive and negative current pulses having a 50 microsecond rise time, 10 millisecond duration, and an amplitude increased in ±50 milliamp increments from ±50 milliamps to ±300 milliamps. No latch-up conditions were detected.

In addition, testing in accordance with JEDEC Standard Number 17 was conducted on the positive supply pins of each integrated circuit using voltage pulses having a 50 microsecond rise time, 10 millisecond duration and an amplitude increased in 1 volt increments up to 15 volts.

Also, testing was conducted on the ground pins using voltage pulses having a 50 microsecond rise time, a 10 millisecond duration and an amplitude increased in 1 volt increments from −2 volts to 2 volts. No latch-up conditions were detected during any of the, tests.

In illustrative embodiments of the present invention described above, specific components have been described for performing specific functions of EOS/ESD protection circuits of embodiments of the present invention. As understood by those skilled in the art, the primary protection circuit could be achieved using a clamping device other than an NMOS transistor, and the feedback circuits of embodiments of the present invention used for controlling the primary protection circuit could be replaced with equivalent devices, that perform the same function.

Having thus described at least one illustrative embodiment of the invention, various alterations, modification and improvements will readily occur to those skilled in the art. Such alterations, modifications and improvements are intended to be within tie scope and spirit of the invention. Accordingly, the foregoing description is by way of example only and is not intended as limiting. The invention's limit is defined only in the following claims and the equivalents thereto.

What is claimed is:

1. A transient protection circuit for protecting a semiconductor device from EOS/ESD events, the transient protection circuit comprising:

a first input adapted to connect to an Input/Output (I/O) pad of the semiconductor device;

a second input adapted to connect to a reference supply voltage of the semiconductor device;

a third input adapted to connect to a supply voltage of the semiconductor device;

a first clamping circuit having first and second inputs and an output, the first input of the first clamping circuit being connected to the first input of the transient protection circuit and the output being connected to the second input of the transient protection circuit, the first clamping circuit being arranged to operate in one of a first and a second operational state in response to a value of a control signal received on the second input of the first clamping circuit, wherein in the first operational state, the first clamping circuit provides substantially a short circuit between the first input of the first clamping circuit and the output of the first clamping circuit and in the second operational state, the first clamping circuit provides substantially an open circuit between the first input of the first clamping circuit and the output of the first clamping circuit; and a first feedback circuit including:

a first input coupled to the first input of the transient protection circuit, a second input coupled to the second input of the transient protection circuit, an output coupled to the second input of the first clamping circuit, a first switching device having a first input, a second input coupled to the third input of the transient protection circuit, and an output coupled to the second input of the first clamping circuit, the first input of the first switching device being connected to the first input of the transient protection circuit to provide substantially a short circuit between the first input of the first switching device and the output of the first switching device as soon as a voltage at the first input of the transient protection circuit with respect to the second input of the transient protection circuit exceeds a threshold voltage of the first switching device, and a pull down device having a first input coupled to the output of the first switching device, a second input coupled to the second input of the first switching device and an output coupled to the second input of the transient protection circuit, the pull down device being arranged such that, in the absence of an overvoltage condition at the first input of the transient protection circuit, a voltage across the pull down device from the first input of the pull down device to the output of the pull down device is substantially equal to zero; and wherein the first feedback circuit is arranged to provide the control signal having a first value to the first clamping circuit to select the first operational state in response to an overvoltage condition at the first input of the transient protection circuit with respect to the second input of the transient protection circuit being detected and to provide the control signal having a second value to the first clamping circuit to select the second operational state in response to the overvoltage condition at the first input of the transient protection circuit with respect to the second input of the transient protection circuit not being detected.

2. The transient protection circuit of claim 1, wherein the first switching device includes a PMOS transistor having a source, a gate and a drain respectively coupled to the first input of the first switching device, the second input of the first switching device and the output of the first switching device.

3. The transient protection circuit of claim 2, wherein the first clamping circuit includes a MOS transistor having a drain, a gate and a source respectively connected to the first input of the first clamping circuit, the second input of the first clamping circuit and the output of the first clamping circuit.

4. The transient protection circuit of claim 3, wherein the first feedback circuit further includes a resistor that couples the second input of the first switching device to the third input of the transient protection circuit.

5. The transient protection circuit of claim 4, further comprising a second clamping circuit coupled between the first input of the transient protection circuit and the third input of the transient protection circuit.

6. The transient protection circuit of claim 5, further comprising a third clamping circuit coupled between the first input of the transient protection circuit and the second input of the transient protection circuit.

7. The transient protection circuit of claim 6, further comprising a fourth clamping circuit coupled between the second input of the transient protection circuit and the third input of the transient protection circuit.

8. The transient protection circuit of claim 7, wherein the pull down device includes a MOS transistor, having a drain and a source respectively coupled to the first input of the pull down device and the output of the pull down device, and a gate coupled to the second input of the first switching device.

9. The transient protection circuit of claim 7, wherein the pull down device includes a resistor coupled between the first input of the pull down device and the output of the pull down device.

10. The transient protection circuit of claim 9, wherein the control signal is a first control signal and the transient protection circuit further comprises:

a fifth clamping circuit having first and second inputs and an output, wherein the first input of the fifth clamping circuit is coupled to the third input of the transient protection circuit and the output of the fifth clamping circuit is coupled to the second input of the transient protection circuit, the fifth clamping circuit being constructed and arranged to operate in one of a third and a fourth operational state in response to a value of a second control signal received on the second input of the fifth clamping circuit, wherein in the third operational state, the fifth clamping circuit provides substantially a short circuit between the first input of the fifth clamping circuit and the output of the fifth clamping Circuit and in the fourth operational state the fifth clamping circuit provides substantially an open circuit between the first input of the fifth clamping circuit and the output of the fifth clamping circuit; and a second feedback circuit having a first input coupled to the third input of the transient protection circuit, a second input coupled to the second input of the transient protection circuit and an output coupled to the second input of the fifth clamping circuit, wherein the second feedback circuit is arranged to provide the second control signal having a third value to the fifth clamping circuit to select the third operational state in response to an overvoltage condition at the third input of the transient protection circuit with respect to the second input of the transient protection circuit being detected and to provide the second control signal having a fourth value to the fifth clamping circuit to select the fourth operational state in response to the overvoltage condition at the third input of the transient protection circuit with respect to the second input of the transient protection circuit not being detected.

11. The transient protection circuit of claim 1, wherein the first feedback circuit further includes a resistor that couples the second input of the first switching device to the third input of the transient protection circuit.

12. The transient protection circuit of claim 1, wherein the control signal is a first control signal and the transient protection circuit further comprises:

a second clamping circuit having first and second inputs and all output, the first input of the second clamping circuit being coupled to the third input of the transient protection circuit and the output of the second clamping circuit being coupled to the second input of the transient protection circuit, the second clamping circuit being arranged to operate in one of a third and a fourth operational state in response to a value of a second control signal received on the second input of the second clamping circuit, wherein in the third operational state, the second clamping circuit provides substantially a short circuit between the first input of the second clamping circuit and the output of the second clamping circuit and in the fourth operational state the second clamping circuit provides substantially an open circuit between the first input of the second clamping circuit and the output of the second clamping circuit; and a second feedback circuit having a first input coupled to the third input of the transient protection circuit, a second input coupled to the second input of the transient protection circuit and an output coupled to the second input of the second clamping circuit, wherein the second feedback circuit is arranged to provide the second control signal having a third value to the second clamping circuit to select the third operational state in response to an overvoltage condition at the third input of the transient protection circuit with respect to the second input of the transient protection circuit being detected and to provide the second control signal having a fourth value to the second clamping circuit to select the fourth operational state in response to the overvoltage condition at the third input of the transient protection circuit with respect to the second input of the transient protection circuit not being detected.

13. The transient protection circuit of claim 1, wherein the first clamping circuit includes a MOS transistor having a drain, a gate and a source respectively connected to the first input of the first clamping circuit, the second input of the first clamping circuit and the output of the first clamping circuit, the MOS transistor further having a length and width, wherein a level of protection provided by the transient protection circuit is directly proportional to the width of the MOS transistor.

* * * * *